United States Patent
Nishiwaki et al.

(10) Patent No.: US 9,178,083 B2
(45) Date of Patent: Nov. 3, 2015

(54) SOLAR CELL AND MANUFACTURING METHOD THEREOF

(75) Inventors: Takeshi Nishiwaki, Kobe (JP); Yukihiro Yoshimine, Kobe (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1375 days.

(21) Appl. No.: 12/509,006

(22) Filed: Jul. 24, 2009

(65) Prior Publication Data

US 2010/0018577 A1  Jan. 28, 2010

(30) Foreign Application Priority Data

Jul. 25, 2008  (JP) .................................. 2008-192701

(51) Int. Cl.
- *H01L 31/00* (2006.01)
- *H01L 31/0224* (2006.01)
- *H01L 31/0747* (2012.01)

(52) U.S. Cl.
CPC .... *H01L 31/022425* (2013.01); *H01L 31/0747* (2013.01); *Y02E 10/50* (2013.01)

(58) Field of Classification Search
USPC ................................ 136/256, 255; 438/98, 57
See application file for complete search history.

(56) References Cited

U.S. PATENT DOCUMENTS

| | | | |
|---|---|---|---|
| 6,091,019 A | 7/2000 | Sakata et al. | |
| 2003/0136441 A1* | 7/2003 | Tanaka | 136/256 |
| 2007/0045594 A1* | 3/2007 | Taira | 252/500 |
| 2007/0209697 A1* | 9/2007 | Karakida et al. | 136/256 |

FOREIGN PATENT DOCUMENTS

JP  11-103084 A  4/1999

* cited by examiner

*Primary Examiner* — Thanh-Truc Trinh
(74) *Attorney, Agent, or Firm* — Marvin A. Motsenbocker; Mots Law, PLLC

(57) ABSTRACT

Provided is a solar-cell manufacturing method that is capable of preventing a conductive paste from bleeding and spreading on a photoelectric conversion body. In the provided method of manufacturing a solar cell, a first printing speed at which a first conductive material is printed is faster than a second printing speed at which a second conductive material is printed on the first conductive material.

13 Claims, 3 Drawing Sheets

SOLAR CELL AND MANUFACTURING METHOD THEREOF

CROSS REFERENCE TO RELATED APPLICATIONS

This application claims priority based on 35 USC 119 from prior Japanese Patent Application No. P2008-192701 filed on Jul. 25, 2008, entitled "Manufacturing Method of Solar Cell", the entire contents of which are incorporated herein by reference.

BACKGROUND OF THE INVENTION

1. Field of the Invention

The invention relates to a solar cell and method of manufacturing a solar cell including a plurality of fine line-shaped electrodes that are formed on a photoelectric conversion body.

2. Description of Related Art

Sunlight energy is a clean energy and can be supplied inexhaustibly. Solar cells are capable of converting sunlight energy directly into electric energy, and hence are expected to provide a new energy source from sunlight.

A typical solar cell includes: a photoelectric conversion body configured to receive light and thus generate photogenerated carriers; and a plurality of fine line electrodes configured to collect the photogenerated carriers generated by the photoelectric conversion body. The fine line electrodes are formed by printing a conductive paste onto the photoelectric conversion body by such printing methods as screen printing and offset printing.

In a method that has been proposed to form the fine line electrodes, a conductive paste is printed by the screen printing method repeatedly so that paste prints are laid over one another (see Japanese Patent Application Publication No. Hei 11-103084). According to this method, the fine line electrodes have flat surfaces. So, even use of a highly resistive conductive paste, which is typically used under low-temperature environments, does not cause an increase in the electric resistance of each of the fine line electrodes.

The conductive paste printed on the photoelectric conversion body is so flowable that the conductive paste bleeds and spreads on the photoelectric conversion body. This bleeding and spreading of the conductive paste on the photoelectric conversion body increases the width of the fine line electrodes thereby reducing the light receiving area of the photoelectric conversion body.

This problem is more likely to occur when a plurality of bumps are formed on the surface of the photoelectric conversion body to improve the light-absorbing efficiency by the photoelectric conversion body. Specifically, the conductive paste bleeds and spreads along the spaces located between these bumps (i.e., along the valley-like portions).

SUMMARY OF THE INVENTION

An aspect of the invention provides a method of manufacturing a solar cell that includes: a photoelectric conversion body; and a plurality of fine line electrodes each including a first conductive layer and a second conductive layer formed consecutively one upon the other on the photoelectric conversion body, the method comprises: forming the first conductive layer by printing a first conductive material on the photoelectric conversion body at a first printing speed; and forming the second conductive layer by printing a second conductive material on the first conductive layer at a second printing speed, wherein the first printing speed at which the first conductive material is printed is faster than the second printing speed at which the second conductive material is printed.

According to the above-described method of manufacturing a solar cell, since the first printing speed is faster than the second printing speed, the amount of the first conductive material can be reduced. Consequently, the first conductive material is prevented from bleeding and spreading on the photoelectric conversion body. In addition, since the second printing speed is slower than the first printing speed, the amount of the second conductive material can be increased, and the surface tension caused by the first conductive material enables the second conductive layer to have a narrower linewidth. Consequently, each of the fine line electrodes can be formed thicker, thereby decreasing their electric resistance.

In addition, after the first conductive layer is formed, a heat treatment is preferably performed on the first conductive layer.

Another aspect of the invention provides a solar cell that comprises: a photoelectric conversion body; and a plurality of fine line electrodes on the photoelectric conversion body; each of the plurality of fine line electrodes including: a first conductive layer having a first cross section formed on the photoelectric conversion body; and a second conductive layer having a second cross section that is higher than first cross section formed on the photoelectric conversion body.

The above-described method of manufacturing a solar cell is capable of preventing the conductive paste from bleeding and spreading on the photoelectric conversion body.

DETAILED DESCRIPTION OF EMBODIMENTS (Configuration of Solar Cell)

Figure 1:
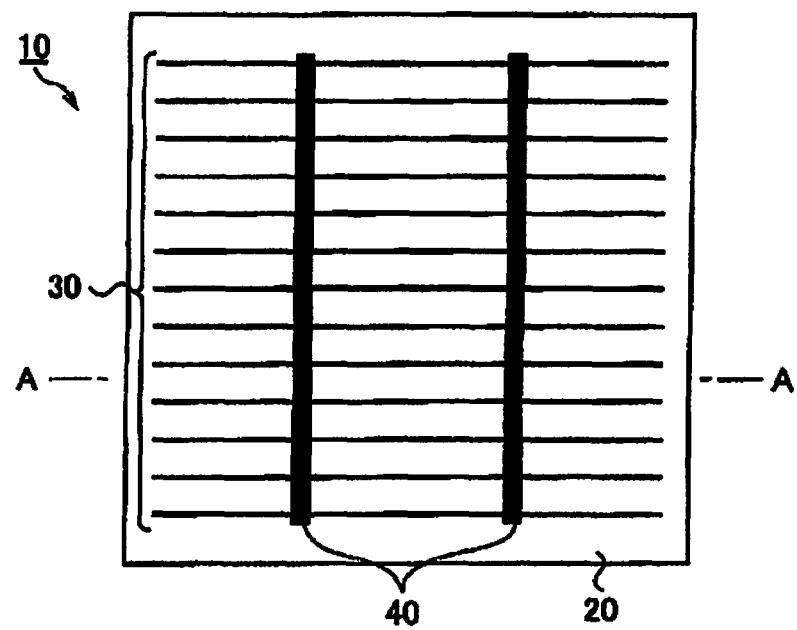
FIG. 1 is a plan view illustrating a light receiving surface of solar cell 10 according to an embodiment of the invention.
Figure 2:
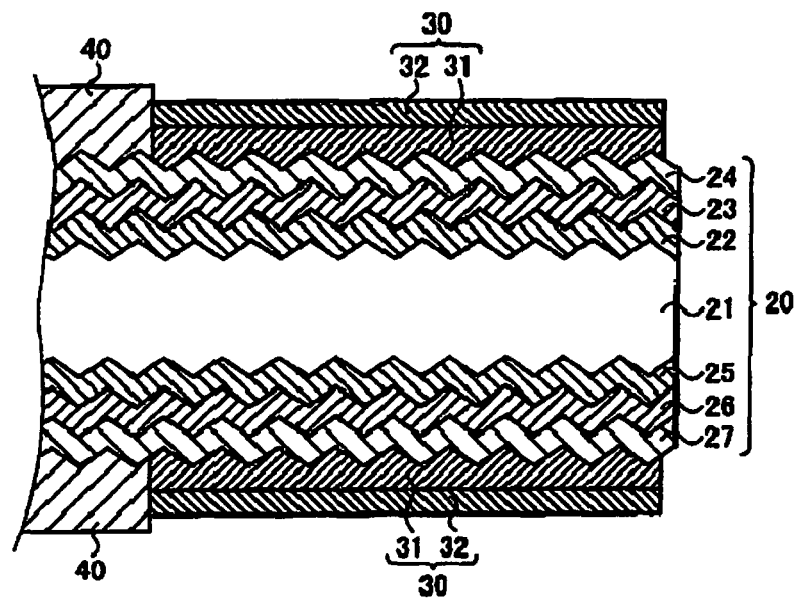
FIG. 2 is a sectional view taken along the line A-A of FIG. 1.

The configuration of a solar cell according to an embodiment of the invention is described below by referring to the drawings. FIG. 1 is a plan view illustrating a light receiving surface of solar cell 10 according to the embodiment. FIG. 2 is a sectional view taken along the line A-A of FIG. 1.

As FIGS. 1 and 2 show, solar cell 10 includes photoelectric conversion body 20, a plurality of fine line-shaped electrodes 30, and connecting electrodes 40.

Photoelectric conversion body 20 includes: a light receiving surface (the upper-side surface in FIG. 2), which is the sunlight-incident surface; and a rear surface (the lower-side surface in FIG. 2), which is the opposite surface to the light receiving surface. The light receiving surface and the rear surface are the main surfaces of solar cell 10.

Photoelectric conversion body 20 includes any of a semiconductor pn junction and a semiconductor pin junction each of which is formed by use of a semiconductor wafer. Photoelectric conversion body 20 thus configured generates photogenerated carriers upon receiving light. The photogenerated carriers refer to holes and electrons generated when photoelectric conversion body 20 absorbs the sunlight. Photoelectric conversion body 20 includes a semiconductor wafer made of a crystalline semiconductor material, such as monocrystalline silicon and polycrystalline silicon. Photoelectric conversion body 20 of this embodiment has a structure known as the HIT structure in which a substantially intrinsic amorphous silicon layer is sandwiched between a monocrystalline silicon wafer and an amorphous silicon layer. The HIT structure reduces defects that would otherwise occur at the interface between the monocrystalline silicon wafer and the amorphous silicon layer, and thus improves the properties of the hetero-junction interface. Specifically, as FIG. 2 shows, photoelectric conversion body 20 includes n type monocrystalline silicon wafer 21 and the following layers. On a first main surface of n type monocrystalline silicon wafer 21, i type amorphous silicon layer 22, p type amorphous silicon layer 23, and ITO layer 24 are formed consecutively one upon another. On a second main surface of n type monocrystalline silicon wafer 21, i type amorphous silicon layer 25, n type amorphous silicon layer 26, and ITO layer 27 are formed consecutively one upon another.

As FIG. 2 shows, a plurality of bumps (texture) are formed both on the first main surface and on the second main surface of n type monocrystalline silicon wafer 21.

The plurality of fine line electrodes 30 are the electrodes configured to collect the photogenerated carries generated by photoelectric conversion body 20. As FIG. 1 shows, the plurality of fine line electrodes 30 are formed substantially all across the light-receiving surface of photoelectric conversion body 20. The plurality of fine line electrodes 30 can be made of various conductive materials. An example of the conductive materials is a resin-type conductive paste having a binder of resin material and a filler of conductive particles such as silver. A sintered conductive paste (also known as a ceramic paste) is another example of the conductive materials. The dimensions and the shape of each fine line electrode 30, and the number of fine line electrodes 30 can be determined appropriately by taking the size and the physical properties of photoelectric conversion body 20 into account. For example, if photoelectric conversion body 20 has a shape of approximately 100 millimeters square, approximately 50 fine line electrodes 30 can be formed while each fine line electrode 30 has a width of 0.03 to 0.15 mm and a thickness of 0.01 to 0.05 mm.

As FIG. 2 shows, each fine line electrode 30 of this embodiment includes: first conductive layer 31 that is formed on photoelectric conversion body 20; and second conductive layer 32 that is formed on first conductive layer 31. First conductive layer 31 and second conductive layer 32 are formed individually with the above-mentioned conductive materials by appropriate printing methods.

The solar cell of the embodiment includes comprises a photoelectric conversion body and a plurality of fine line electrodes on the photoelectric conversion body. Each of the plurality of fine line electrodes includes a first conductive layer having a first cross section formed on the photoelectric conversion body, and a second conductive layer having a second cross section that is higher than first cross section formed on the photoelectric conversion body. The second conductive layer is preferably higher than the first conductive layer. The texture may be formed on the surface of the photoelectric conversion body, and the first conductive layer may be formed on the surface of the texture.

Unillustrated wiring is provided to electrically connect a plurality of solar cells 10, either in series or in parallel. The wiring is connected to electrodes 40 for. Each connecting electrode 40 is formed so as to intersect the plurality of fine line electrodes 30 and each connecting electrode 40 is electrically connected to each of these fine line electrodes 30. Connecting electrodes 40 can be made of a material similar to that used to form fine line electrodes 30. The dimensions and the shape of each connecting electrode 40, and the number of connecting electrodes 40 can be determined appropriately by taking the size and the physical properties of photoelectric conversion body 20 into account. For example, if photoelectric conversion body 20 has a shape of approximately 100 millimeters square, two connecting electrodes 40 can be formed while each connecting electrode 40 has a width of 0.3 to 2.0 mm and a thickness of 0.01 to 0.05 mm.

As FIG. 2 shows, fine line electrodes 30 and connecting electrodes 40 of this embodiment are formed also on the rear surface of photoelectric conversion body 20, but this is not the only possible configuration. Alternatively, fine line electrodes 30 may be formed so as to cover substantially all the rear surface of photoelectric conversion body 20. In addition, the invention limits neither the shapes of fine line electrodes 30 nor the shapes of connecting electrodes 40 if these electrodes 30 and 40 are formed on the rear surface of photoelectric conversion body 20.

(Manufacturing Method of Solar Cell)

A method of manufacturing a solar cell 10 according to the embodiment of the invention is now described by referring to the drawings.

First, n type monocrystalline silicon wafer 21 is subjected to an etching process, so that the surface of n type monocrystalline silicon wafer 21 has minute asperities (texture).

Subsequently, on the first main surface of n type monocrystalline silicon wafer 21, i type amorphous silicon layer 22 and p type amorphous silicon layer 23 are consecutively formed one upon the other by the chemical vapor deposition (CVD) method. Likewise, on the second main surface of n type monocrystalline silicon wafer 21, i type amorphous silicon layer 25 and n type amorphous silicon layer 26 are consecutively formed one upon the other.

Subsequently, by the sputtering method or the like, ITO layer 24 is formed on p type amorphous silicon layer 23 and ITO layer 27 is formed on n type amorphous silicon layer 26.

Figure 3:
FIG. 3 is a diagram for describing a method of forming a plurality of fine line electrodes 30 according to the embodiment of the present invention (Part 1).

Subsequently, first conductive layer 31 is formed by printing first conductive material 31S on photoelectric conversion body 20 by the screen printing method. Specifically, as FIG. 3 shows, first conductive material 31S that is placed on screen plate 51 is pushed out by squeegee 52 onto photoelectric conversion body 20. The emulsion that coats the mesh wires (gauze) of screen plate 51 is removed from the part that corresponds to the pattern of fine line electrodes 30. First conductive material 31S is pushed out onto photoelectric conversion body 20 through the region of screen plate 51 from which the emulsion is removed.

Figure 4:
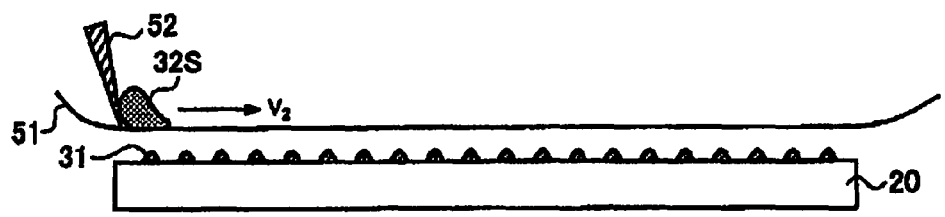
FIG. 4 is a diagram for describing a method of forming the plurality of fine line electrodes 30 according to the embodiment (Part 2).
Figure 5:
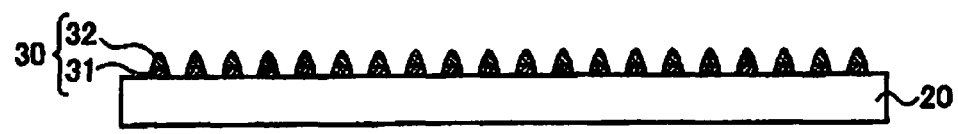
FIG. 5 is a diagram for describing a method of forming the plurality of fine line-shaped electrodes 30 according to the embodiment (Part 3).

Subsequently, second conductive layer 32 is formed by printing second conductive material 32S on first conductive layer 31 by the screen printing method. Specifically, as FIG. 4 shows, second conductive material 32S that is placed on screen plate 51 is pushed out by squeegee 52 onto photoelectric conversion body 20. Second conductive material 32S is pushed out onto first conductive layer 31 through the region of screen plate 51 from which the emulsion is removed. At this time, first conductive material 31S has not been dried yet, so that surface tension acts on second conductive material 32S printed on first conductive layer 31. FIG. 5 shows the plurality of fine line electrodes 30 thus formed on photoelectric conversion body 20.

FIG. 3 shows that first conductive material 31S is printed at first printing speed V1, which is the same as the moving speed of squeegee 52 in this process. In addition, FIG. 4 shows that second conductive material 32S is printed at second printing speed V2, which is the same as the moving speed of the squeegee 52 at that process. In this embodiment, first printing speed V1 is faster than second printing speed V2.

Each of first printing speed V1 and second printing speed V2 can be set, for example, at 30 to 200 mm/sec, but this is not the only possible speed range for each of first and second printing speeds V1 and V2. Rather, it is preferable that first printing speed V1 and second printing speed V2 be set appropriately by taking the viscosities of first conductive material 31S and of second conductive material 32S as well as the line-width of each fine line electrode 30 into account.

In addition, connecting electrodes 40 can be formed simultaneously with the formation of the plurality of fine line electrodes 30 by also removing the emulsion from the region of screen plate 51 corresponding to the pattern of connecting electrodes 40.

Subsequently, resultant solar cell 10 is heated at a temperature of one hundred and several tens of degrees centigrade so as to harden first conductive material 31S and second conductive material 32S.

(Advantageous Effects)

According to the method of manufacturing a solar cell 10 of the embodiment, first printing speed VI at which first conductive material 31S is printed is faster than second printing speed V2 at which second conductive material 32S is printed.

Figure 6:
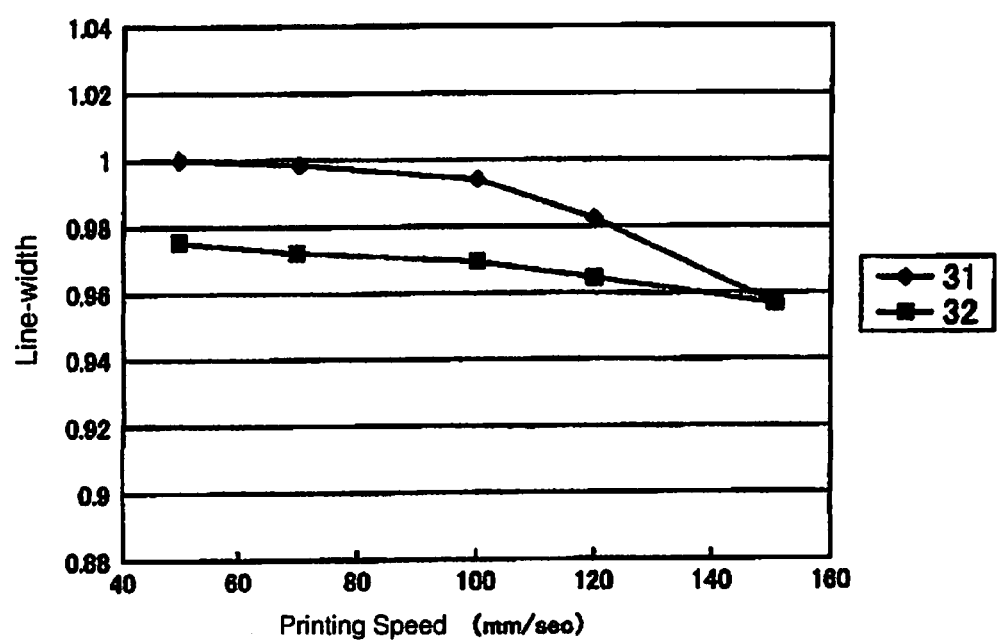
FIG. 6 is a graph showing the relationship between first printing speed V1 and the line-width of first conductive layer 31 as well as the relationship between second printing speed V2 and the line-width of second conductive layer 32.

FIG. 6 shows the relationship between first printing speed V1 and the line-width of first conductive layer 31, and also the relationship between second printing speed V2 and the line-width of second conductive layer 32. Note that the values on the vertical axis of the graph shown in FIG. 6 are normalized values with the line-width of first conductive layer 31 formed at a speed of 50 mm/sec being 1.

FIG. 6 shows that the line-widths of conductive layers 31 and 32 tend to be narrower as their respective printing speeds V1 and V2 increase. This is because the faster the printing speed becomes, the smaller the amount of the conductive material pushed out of screen plate 51 becomes.

In addition, the line-width of second conductive layer 32 tends to become narrower than the line-width of first conductive layer 31 for the following reason. The texture formed in the surface of photoelectric conversion body 20 makes first conductive material 31S more likely to bleed and spread while the surface tension caused by first conductive material 31S and acting on second conductive material 32S makes second conductive material 32S less likely to bleed and spread.

According to the embodiment, since first printing speed V1 is faster than second printing speed V2, the amount of pushed-out first conductive material 31S becomes smaller. Accordingly, first conductive material 31S can be prevented from bleeding and spreading on photoelectric conversion body 20. Consequently, the line-width of first conductive layer 31 can be narrower, which results in a larger light receiving area of photoelectric conversion body 20.

In addition, since second printing speed V2 is slower than first printing speed V1, the amount of pushed-out second conductive material 32S becomes larger and the surface tension caused by first conductive material 31S allows second conductive layer 32 to have a narrower line-width. Consequently, each of fine line electrodes 30 can be formed thicker, which results in a smaller electric resistance of each of fine line electrodes 30.

(Other Embodiments)

An embodiment of the invention has been given thus far, but the descriptions and the drawings that form parts of this disclosure should not be understood as limiting the invention. With this disclosure, those skilled in the art may think of various alternative embodiments, examples, and implementation techniques.

For example, each of fine line electrodes 30 of the above-described embodiment has a two-layer structure. Each of fine line electrodes 30, however, may have a structure with more than two layers. In this case, the printing speed for the third or more consecutive layers is preferably faster than first printing speed V1.

In addition, the plurality of fine line electrodes 30 of the above-described embodiment are formed by the screen printing method, but this is not the only possible method that can be employed. Alternatively, the offset printing method may be employed to form the plurality of fine line electrodes 30. Specifically, first conductive layer 31 may be formed by transferring first conductive material 31S placed with a predetermined pattern on a blanket onto photoelectric conversion body 20. Likewise, second conductive layer 32 may be formed by transferring second conductive material 32S placed with a predetermined pattern on the blanket onto first conductive layer 31. First printing speed V1 in this case is the transferring speed at which first conductive material 31S is transferred onto photoelectric conversion body 20 (i.e., either the rotational speed of the blanket or the moving speed of photoelectric conversion body 20). Second printing speed V2 is the transferring speed at which second conductive material 32S is transferred onto first conductive layer 31 (i.e., either the rotational speed of the blanket or the moving speed of photoelectric conversion body 20).

In addition, although no special mention has been made in the above-described embodiment, second conductive layer 32 may be formed on first conductive layer 31 after the solvent contained in first conductive layer 31 is evaporated by subjecting first conductive layer 31 to a heat treatment. The heat treatment enables first conductive layer 31 to absorb the solvent contained in the second conductive layer 32, so that the line-width of second conductive layer 32 can be even narrower. Note that the heat treatment on first conductive layer 31 has to be carried out under such conditions that allow at least part of the solvent contained in first conductive layer 31 to be evaporated and, at the same time, that keep first conductive layer 31 from being hardened.

In addition, first conductive material 31S in the above-described embodiment is the same material as that of second conductive material 32S, but, alternatively, first and second conductive materials 31S and 32S may be different from each other.

In addition, the above-described embodiment is based on an assumption that the invention is applied to an HIT-type solar cell, but the invention may be applied to other types of solar cells, such as a thin-film solar cell.

In summary, it is clear that the invention includes various other embodiments than those described above. Accordingly, the technical scope of the invention must be determined by those features which are described in the claims and relevant to the descriptions given thus far and which can characterize the invention.

EXAMPLES

What follows is a specific description of various examples of the solar cell according to the invention, but the examples given below are not the only ones of the invention. The invention can be carried out in various appropriately modified forms as long as the gist of the invention is kept intact.
(Fabrication of Solar Cells)

Solar cells of Comparative Examples and Examples of the invention are fabricated in the following way.

To begin with, an anisotropic etching process is performed on n type monocrystalline silicon wafers each 104 millimeters square, so that a plurality of bumps (texture) are formed on the surface of the n type monocrystalline silicon wafers.

Subsequently, on a first main surface of each n type monocrystalline silicon wafer, an i type amorphous silicon layer of an approximately 10-nm thickness and a p type amorphous silicon layer of an approximately 10-nm thickness are formed consecutively one upon the other by the plasma CVD method. Then, on a second main surface of each n type monocrystalline silicon wafer, an i type amorphous silicon layer of an approximately 10-nm thickness and an n type amorphous silicon layer of an approximately 10-nm thickness are formed consecutively one upon the other. After that, an ITO film is formed on each of the p type and n type amorphous silicon layers by the sputtering method.

Subsequently, resin-type conductive pastes are printed, one upon another, on the photoelectric conversion body by the screen printing method, so that fine line electrodes and connecting electrodes are formed.

While first printing speed V1 and second printing speed V2 for printing the resin-type conductive pastes are set as listed in Table 1, solar cells of Comparative Examples 1 to 4 and Examples 1 to 3 are fabricated (one hundred cells of each kind are fabricated).

TABLE 1

|  | V1 (mm/sec) | V2 (mm/sec) |
| --- | --- | --- |
| Comparative Example 1 | 50 | 50 |
| Comparative Example 2 | 50 | 100 |
| Comparative Example 3 | 50 | 150 |
| Comparative Example 4 | 150 | 150 |
| Example 1 | 100 | 50 |
| Example 2 | 150 | 50 |
| Example 3 | 150 | 100 |

As Table 1 shows, first printing speed V1 is equal to or slower than second printing speed V2 for each of Comparative Examples 1 to 4 while the first printing speed V1 is faster than second printing speed V2 for each of Examples 1 to 3.
(Comparison of Solar-Cell Characteristics)

Some characteristics of the solar cells of Comparative Examples 1 to 4 and of Examples 1 to 3 were measured. The measurement results are listed in Table 2. Note that the values of $I_{sc}$, F.F., and $I_{sc} \times$F.F. in Table 2 are values normalized by the measured values for Comparative Example 1.

TABLE 2

|  | Width of Electrode (μm) | Height of Electrode (μm) | $I_{SC}$ | F.F. | $I_{SC} \times$ F.F. |
| --- | --- | --- | --- | --- | --- |
| Comparative Example 1 | 89.9 | 34.3 | 1.000 | 1.000 | 1.000 |
| Comparative Example 2 | 90.1 | 33.2 | 0.999 | 0.997 | 0.996 |
| Comparative Example 3 | 89.8 | 32.3 | 0.999 | 0.994 | 0.993 |
| Comparative Example 4 | 86.5 | 29.4 | 1.030 | 0.971 | 1.000 |
| Example 1 | 88.4 | 33.4 | 1.011 | 0.997 | 1.008 |
| Example 2 | 87.6 | 32.5 | 1.023 | 0.993 | 1.016 |
| Example 3 | 87.1 | 30.8 | 1.025 | 0.981 | 1.006 |

Table 2 shows that the characteristics of the solar cells of Examples 1 to 3 are more favorable than the characteristics of the solar cells of Comparative Examples 1 to 4.

Some of the reason for this are: fast first printing speeds V1 for the solar cells of Examples 1 to 3 allow each of the fine line electrodes of these solar cells to be narrower; and slow second printing speeds V2 for the solar cells of Examples 1 to 3 allow each of the fine line-shaped electrodes to be thicker. Note that the light receiving area of each solar cell of Example 1 to 3 is approximately 3% larger than its counterpart of each solar cell of Comparative Examples 1 to 3.

Slow first printing speeds V1 for the solar cells of Comparative Examples 1 to 3 makes each of the fine line electrodes wider than each of their counterparts in Examples 1 to 3. Consequently, the light receiving areas of the photoelectric conversion bodies of Comparative Examples 1 to 3 become smaller, which results in lower $I_{sc}$ values for Comparative Examples 1 to 3.

In addition, fast second printing speeds V2 for the solar cells of Comparative Examples 2 to 4 make the fine line electrodes of these solar cells thinner than their counterparts in Examples 1 to 3. Consequently, the fine line electrodes of the solar cells of Comparative Examples 2 to 4 have larger electric resistances, which results in lower F.F. values for these solar cells. The above-described facts show that faster first printing speed V1 than second printing speed V2 allows each of the fine line electrodes to be narrow and thick.

According to the embodiment described above, the solar cell and manufacturing method thereof capable of preventing the conductive paste from bleeding and spreading on the photoelectric conversion body are provided.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A method of manufacturing a solar cell that includes: a photoelectric conversion body; and a plurality of fine line electrodes each including a first conductive layer and a second conductive layer formed consecutively one upon the other on the photoelectric conversion body, the method comprising:
   forming the first conductive layer by printing a first conductive material on a textured surface of the photoelectric conversion body at a first printing speed; and
   forming the second conductive layer by printing a second conductive material on the first conductive layer at a second printing speed, wherein the first printing speed at which the first conductive material on the textured surface is printed is faster than the second printing speed at which the second conductive material is printed on the first conductive material.

2. The method of claim 1,
wherein the first printing speed is a first speed at which a squeegee moves to push through a screen plate the first conductive material onto the photoelectric conversion body, and
the second printing speed is a second speed at which the squeegee moves to push through the screen plate the second conductive material onto the first conductive layer.

3. The method of claim 1,
wherein the first printing speed is a first transfer speed at which the first conductive material placed on a blanket is transferred to the photoelectric conversion body, and
the second printing speed is a second transfer speed at which the second conductive material placed on the blanket is transferred onto the first conductive layer.

4. The method of claim 1, wherein the first conductive material and the second conductive material are the same.

5. The method of claim 1, further comprising performing a heat treatment of the first conductive layer after the formation of the first conductive layer but prior to the formation of the second conductive layer.

6. The method of claim 1, wherein the first printing speed is determined on the basis of the viscosity of the first conductive material.

7. The method of claim 1, wherein the first printing speed is determined on the basis of the line-width of each of the fine line electrodes.

8. The method of claim 2, wherein the second conductive material is pushed out onto the first conductive material through the region of the screen plate from which an emulsion is removed.

9. The method of claim 1, wherein the first conductive material in which the second conductive material is printed on comprises a non-textured surface.

10. A method of manufacturing a solar cell that includes: a photoelectric conversion body; and a plurality of fine line electrodes each including a first conductive layer and a second conductive layer formed consecutively one upon the other on the surface of the photoelectric conversion body, the method comprising:
forming the first conductive layer having a first width, by printing a first conductive material on a textured surface of the photoelectric conversion body; and
forming the second conductive layer having a second width, by printing a second conductive material on the first conductive layer during a time when the first conductive material has not been dried yet,
wherein the second width is narrower than the first width, and
wherein a first printing speed at which the first conductive material is printed on the textured surface is faster than a second printing speed at which the second conductive material is printed on the first conductive material.

11. The method of claim 10, wherein the first conductive material in which the second conductive material is printed on comprises a non-textured surface.

12. A method of manufacturing a solar cell that includes: a photoelectric conversion body; and a plurality of fine line electrodes each including a first conductive layer having a first width and a second conductive layer having a second width narrower than the first width formed consecutively one upon the other on the photoelectric conversion body, the method comprising:
forming the first conductive layer by printing a first conductive material on a textured surface of the photoelectric conversion body at a first printing speed; and
forming the second conductive layer by printing a second conductive material on the first conductive layer at a second printing speed,
wherein the first printing speed at which the first conductive material is printed on the textured surface is faster than the second printing speed at which the second conductive material is printed on the first conductive material.

13. The method of claim 12, wherein the first conductive material in which the second conductive material is printed on comprises a non-textured surface.

* * * * *